United States Patent [19]

Boreas

[11] 4,211,972
[45] Jul. 8, 1980

[54] SELF CONTAINED FILAR SUSPENDED METER ROTOR

[75] Inventor: Willem J. L. Boreas, Sayreville, N.J.

[73] Assignee: Sangamo Weston, Inc., Norcross, Ga.

[21] Appl. No.: 929,884

[22] Filed: Jul. 31, 1978

[51] Int. Cl.² ............ G01R 5/02; G01R 1/02
[52] U.S. Cl. ............................................. 324/154 R
[58] Field of Search ............ 324/154 R, 154 PB, 155, 324/150

[56] References Cited

U.S. PATENT DOCUMENTS

| | | |
|---|---|---|
| 3,090,007 | 5/1963 | Palmer . |
| 3,111,623 | 11/1963 | Thomander . |
| 3,277,370 | 10/1966 | Clark .............................. 324/154 R |
| 3,493,864 | 2/1970 | Donath et al. ................. 324/154 R |
| 3,590,375 | 6/1971 | Sills ............................... 324/154 R |
| 4,019,137 | 4/1977 | Takeda et al. ................. 324/154 R |

FOREIGN PATENT DOCUMENTS

| | | |
|---|---|---|
| 1921038 | 11/1970 | Fed. Rep. of Germany ...... 324/154 R |
| 1004201 | 9/1965 | United Kingdom . |
| 1124667 | 8/1968 | United Kingdom ................. 324/154 R |
| 1212245 | 11/1970 | United Kingdom . |

*Primary Examiner*—Gerard R. Strecker

[57] ABSTRACT

A meter rotor includes a preferably hollow shaft for caging filaments or ribbons, means such as openings on the shaft for engaging a coil, a pair of axially movable end caps engaging opposing ends of the shaft, a spring associated with each end cap for holding the filaments or ribbons taut but without necessarily deflecting the springs, and means on the end caps for engaging a stator.

The rotor cooperates with a stator which has rotor-engaging means corresponding to the stator-engaging means on the end caps. The rotor engaging means are separated by a first distance which is greater than a second distance between the stator engaging means. The first and second distances are in a predetermined relationship so that when the rotor is positioned in the stator and the end caps are moved axially, the stator engaging means engage the stator, thereby deflecting the springs to apply tension to the filaments or ribbons.

15 Claims, 7 Drawing Figures

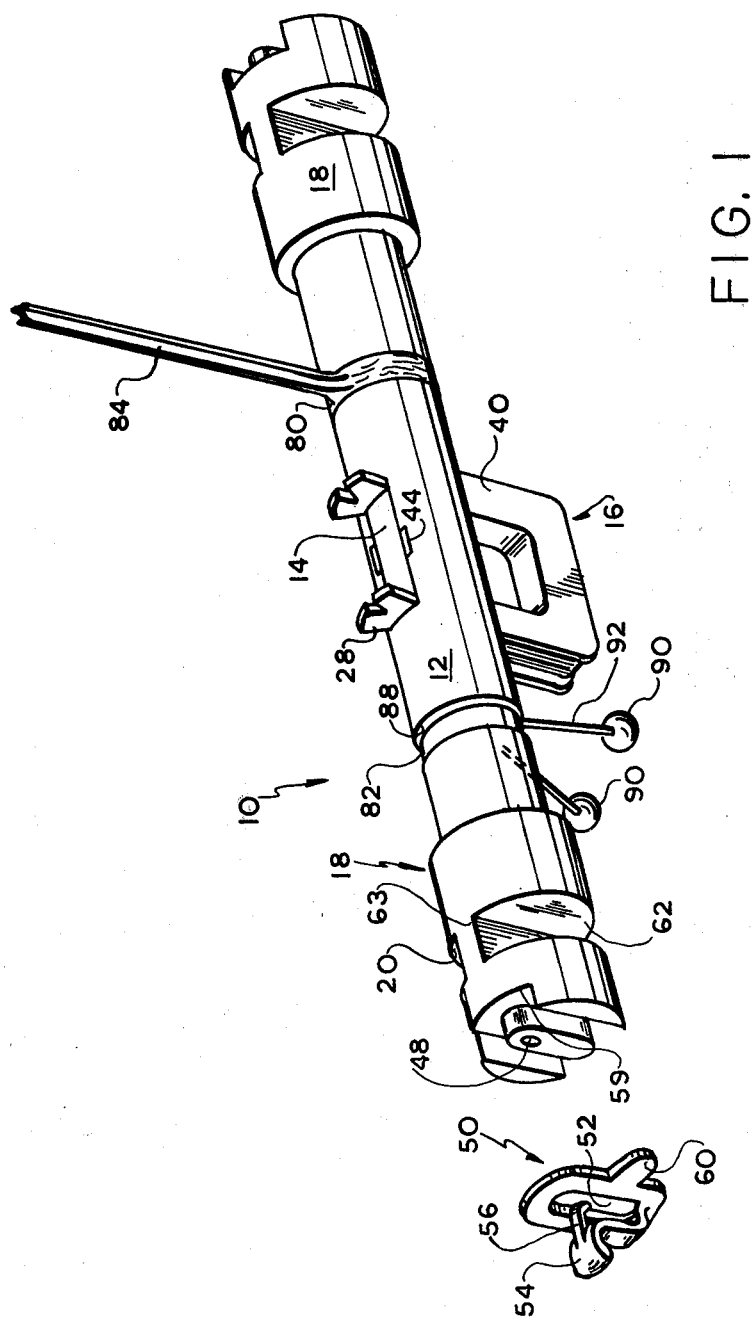

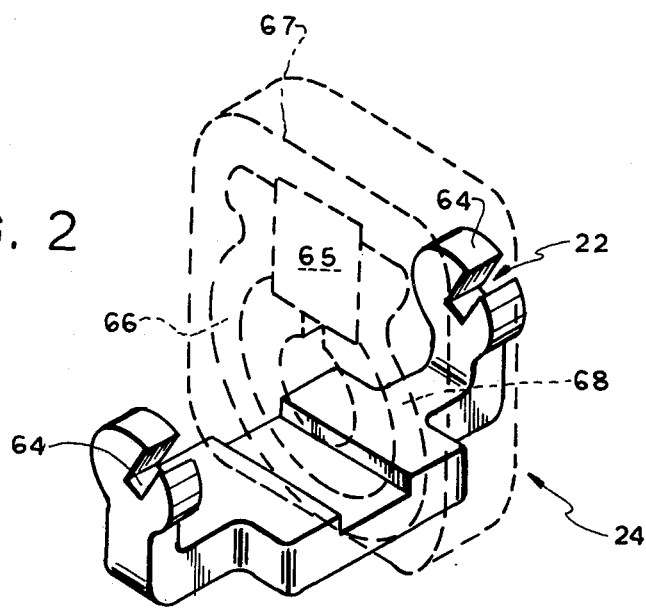
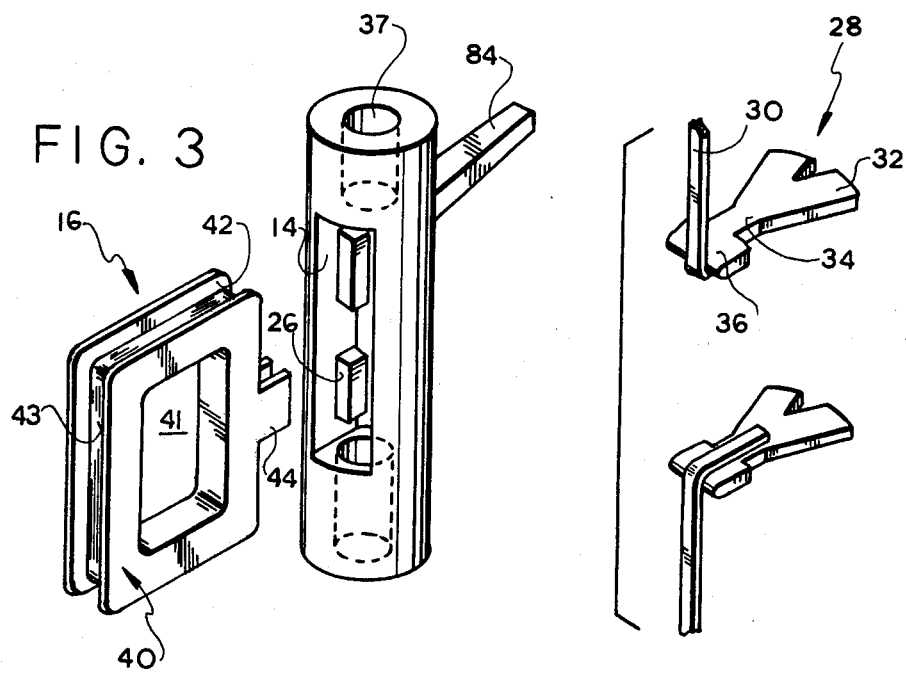

SELF CONTAINED FILAR SUSPENDED METER ROTOR

BACKGROUND OF THE INVENTION

The present invention relates to taut band or filament-suspended rotors and stators used in meters.

Analog meters for measuring electrical quantities of the permanent magnet moving coil type include both the suspension galvanometer and the very popular D'Arsonval mechanism. Each of these movements broadly includes two major functional assemblies—the rotor and the stator. The rotor includes a coil of fine wire, and the stator includes the magnet and scale; a suspension system mechanically joins the rotor and stator. Of the various suspensions that have been used for permanent magnet moving coil mechanisms, one type involves a pair of fine filaments suspending the coil and is used principally in suspension galvanometers. A similar suspension uses taut bands, which are short metal-alloy ribbons or bands under tension. A further type is the pivot and jewel mechanism, which uses a jeweled bearing similar to those used in clocks and watches. The present invention relates particularly to the filar and taut band suspensions. As used herein, the term "filar" is meant to refer to both the fine filament and the taut band types.

In prior art the filar suspended rotor has always been assembled as part of a complete instrument. Individual rotor parts were mounted or secured in or around the stator parts, which included the spring components to provide tension to the suspension system. This practice has at least two disadvantages. First, the delicate rotor parts must be handled together with the larger and more massive stator parts, thereby exposing the rotor to potential damage. Second, the rotor has limited accessability when mounted in the stator.

Accordingly, the principal object of this invention is to provide a new design for a rotor for a D'Arsonval or electrodynamometer electrical instrument to overcome these problems inherent in the prior art.

Another main object is to provide a rotor which may be completely assembled and balanced as an independent unit and later placed in a suitably adaped stator.

A further object of the present invention is to provide such an improved rotor which includes structure to limit the axial and lateral movement of the filament or taut band. Such structure is desirable since it allows the meter to be used in a more rugged environment and retain substantially its accuracy despite being jolted, banged or dropped. An example of such structure is disclosed in my U.S. Pat. No. 3,678,383, entitled "High Impact Withstanding Taut Band Suspension Instrument."

SUMMARY OF THE INVENTION

These objects are achieved by providing a rotor which itself contains the spring or springs which tension the taut bands or filaments. However, the spring does not apply full tension until a movable end cap is moved axially to engage structure on the stator. The rotor includes a shaft, means such as openings on the shaft for engaging a coil and at least one but in the preferred mode a pair of the end caps engaging opposing ends of the shaft. At least one of the caps is axially movable, and a spring is associated with at least one end of the shaft. Before mounting the rotor on the stator the spring holds the filament or ribbon without substantially deflecting the spring. Finally, the rotor includes stator-engaging means on each end cap for engaging corresponding rotor engaging means of a stator. The rotor engaging means are separated by a first distance which is greater than a second distance separating the stator-engaging means. The first and second distances are in a predetermined relationship so that when the rotor is positioned in the stator and the axially movable end cap is moved axially away from the other end cap, the rotor's stator-engaging means firmly engages the stator. The axial movement deflects the spring which applies proper tension to the filaments or taut bands.

In the preferred embodiment the shaft is hollow and houses the band or filament, so that when the rotor is mounted on the stator in this fashion, the hollow shaft provides caging for the filament, that is, it limits the lateral movement of the ribbon or filament. Also, in the preferred embodiment both end caps are axially movable and each end of the shaft has an associated spring. The preferred spring includes a circular portion, with an aperture therein for passing the band and a lever extension to which the band is fixedly fastened.

BRIEF DESCRIPTION OF THE DRAWINGS

In providing a detailed description of the preferred embodiments of a device built according to the present invention, reference is made to the appended drawings in which:

FIG. 1 is a schematic view of a rotor built in accordance with the present invention;

FIG. 2 is a schematic view of a stator with which the rotor shown in FIG. 1 may be used;

FIG. 3 is an expanded schematic view of the portion of the rotor containing the coil;

FIG. 4 is an ilustrative view showing the portion of the rotor where the filament or ribbon is connected internally proximate the coil;

DESCRIPTION OF A PREFFERRED EMBODIMENT

Figure 5:
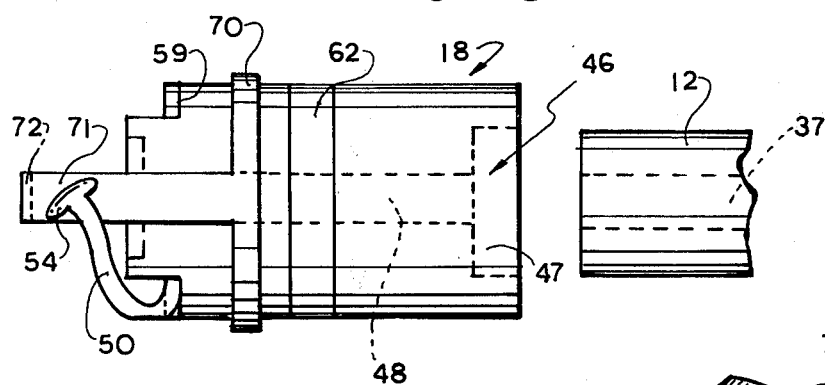
FIG. 5 is a side sectional view of an end cap.

Referring now to FIG. 1 of the drawings, a rotor 10 built in accordance with the present invention includes a hollow cylindrical shaft 12 having a lateral opening 14 for engaging an edge mounted coil 16. At opposing ends of shaft 12 are a pair of opposing end caps 18 each having stator-engaging means, illustratively opposing channels 20 to engage corresponding portions 22 of a stator 24 (FIG. 2). It will be understood that the present invention is not limited to edge mounted coils, however, and extends to other coil mounting schemes, for instance, center mounted coils and eccentric mounted coils.

Shaft 12 may be formed of a nonconductive material, such as a thermoset rigid plastic, for example. As best seen in FIGS. 1 and 3, opening 14 is rectangular and perpendicular to the axis of shaft 12 and passes radially therethrough. At one mouth of opening 14 each of the four corners is provided with a stop member 26 radially inward from the outside surface of shaft 12. A pair of fantail members 28 (shown in detail in FIG. 4) made of brass, for example, fits within opening 14 to engage the suspension wires or ribbons 30 and to act as a counterweight. Each fantail member 28 includes a fantail portion 32 meeting a neck 34 at the narrow end. The opposite end of neck 34 expands into a shoulder 36. Fantail members 28 each are dimensioned to be mounted on shaft 12 by inserting the neck 34 and shoulder 36 into opening 14 at the central portion thereof and sliding fantail member 28 axially so that neck 34 moves between stop members 26 and shoulder 36 moves beneath them. Hence, fantail member 28 each extend radially from shaft 12 when mounted thereon. Each ribbon 30 passes over the preferably smoothed free end of its respective shoulder 36 through hole 37 extending axially through hollow shaft 12, and may secured to its respective fantail member by soldering or welding. The soldering or welding may be done either before or after positioning fantail members 28 in saft 12. Ribbons 30 are conventional and made of, by way of non-limitative example, a 90% nickel, 10% platinum alloy.

Referring again to FIG. 3, coil 16 is conventional and includes a metallic frame 40 with four sides defining an opening 41 therein. Frame 40 includes flanges 42 which serve as guides for windings 43. Coil 16 also includes a pair of tabs 44 extending from flanges 40 on one side of the coil. Preferably, both of tabs 44 are locatd centrally aong one leg of coil 16 which is dimensioned in length and width so that the coil 16 may be inserted into shaft 12 through the mouth of opening 14 opposite stop members 26. Coil 16 is inserted until flanges 42 reach stop members 26 whereupon tabs 44, which then extend beyond shaft 12, may be bent around the outside of shaft 12 to secure coil 16 thereto. If necessary, insulating tape may be applied to coil 16 to separate electrically the coil from fantail members 28. Each fantail member 28 is secured against movement by the end walls of the rectangular opening 14, the stop members 26 in opening 14, and by coil 16 after it has been mounted. Each end of winding 43 is connected to a corresponding fantail member 28 thereby providing continuous electrical connection from the suspension wire 30 to coil winding 43.

Referring to FIGS. 1 and 5, the preferred embodiment includes at each end of shaft 12 a corresponding end cap 18 which has a stepped diameter axial hole 46 at one end so that cap 18 can be fitted over an end of shaft 12 until the shoulder 47 formed by the step inside the cap is met. The smaller diameter hole 48 extends entirely through cap 18 so that ribbon 30 may be positioned axially therein. Caps 18 can be made of the same material which forms shaft 12.

A spring member 50 for tensioning ribbon 30 mounts on the free end of cap 18, i.e. spaced from shaft 12. Member 50 may be made of a flexible spring material, such as berylium copper or phosphor bronze alloys, for example. Spring 50 may take a variety of equivalent forms, and in the illustrated embodiment is generally oblong and includes a central aperture 52 to admit ribbon 30. A lever extension 54 extends from the periphery of member 50 in a radially inward and axially outward direction. Extension 54 has a curved peak 56 which is located axially over hole 48.

Each end of cap 18 includes structure to engage the corresponding spring member 50. In the illustrated embodiment this includes a recessed portion 59 which is effectively the geometric complement of spring member 50. After spring member 50 is inserted into the recess 59, its curved peak 56 is positioned over hole 48 passing axially through cap 18. When both end caps 18 are placed over the corresponding ends of shaft 12, ribbons 30 pass through the aperture 52 of spring member 50 and over the curved ends 56 of lever extensions 54. Each free end of ribbons 30 is pulled over a lever extension 54. The free ends of ribbons 30 are then secured to the spring by soldering or welding. Spring member 50 also includes a solder lug or equivalant means 60 extending from the periphery thereof to connect electrically the rotor 10 to circuitry within the meter to receive a signal corresponding to the unknown to be measured.

The outside of each end cap 18 includes a pair of opposing channels 62 cutting through opposite lateral sides of the end cap. As is apparent from FIG. 1, the base of each such channel 62 constitutes a secant of the otherwise circular perimeter of the end cap. The portion 63 between the bases of opposing channels 62 is dimensioned to engage a corresponding slot 64 on stator 24 (FIG. 2). The stator 24 also includes a magnet 65 having one pole coupled magnetically to an annular pole piece 66. The other pole is coupled magnetically to a pole piece 67 radially outward from pole piece 66 and separated therefrom by an annular air gap 68 in which the radially outermost leg of coil 16 moves.

The distance between the two slots 64 is slightly greater than the distance between the two portions 63 so that when engaging rotor 10 in stator 24 the end caps 18 must be moved axially apart until both portions 63 engage the corresponding slots 64. This axial movement deflects the lever extensions 54 which act as springs and apply tension to ribbons 30.

Figure 6:
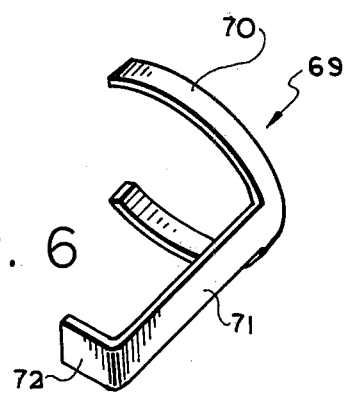
FIG. 6 is a view of a stop plate.

It will be evident to those skilled in this art that the shoulders 47 in end caps 18, axial opening 37 in shaft 12 and the aperture 48 of end cap 18 protect the ribbons 30 from excessive lateral or axial movement. The amount of this caging is determined, inter alia, by the larger diameter of the stepped hole 46 and the outside diameter of the end of shaft 12. Typically the hole diameter will exceed the shaft diameter by about 15-30 mils. Such caging is highly desirable since it enables the suspension to withstand vibration and shock. To improve the "ruggedized" requirements of rotor 10, a stop plate 69 best seen in FIG. 6 may optionally be provided. Plate 69 includes a circular portion 70 which fixedly engages cap 18, and an arm 71 extending axially therefrom. A portion 72 extends radially inward from the end of arm 71 so that it is adjacent lever extension 54. If the meter is jolted and rotor 12 is axially displaced it will move an end cap 18 axially until lever extension 54 meets portion 72. This consequently releases tension on the ribbon 30 corresponding to the moved end cap 18. In this regard see my earlier U.S. Pat. No. 3,678,383.

Figure 7:
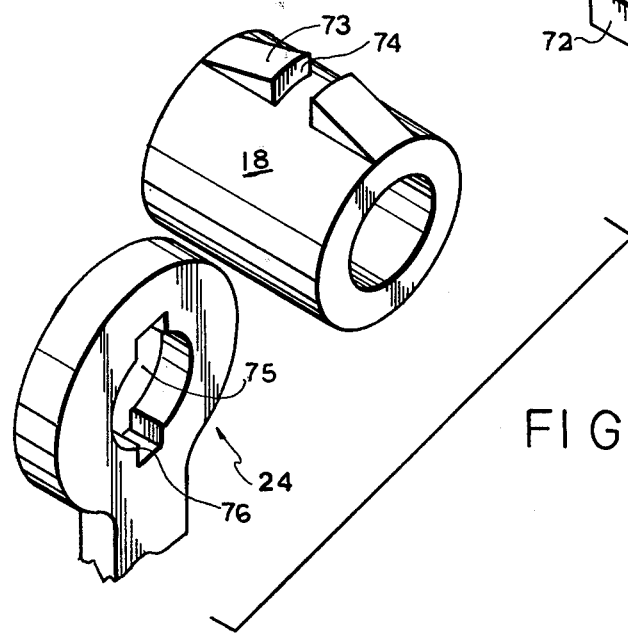
FIG. 7 is an illustrative view of an alternative end cap embodiment and the stator portion therefor.

FIG. 7 shows an alternate embodiment of the outside of end cap 18 and the engaging portion of stator 22. Here each end cap includes a pair of ramps 73 located axially on the outside surface having the slopes thereof in opposing directions with the free ends of ramps 73 forming opposing faces 74. Stator 24 includes an aperture 75 which is generally circular, having a diameter slightly larger than the outside diameter of end cap 18. Slots 76 extend radially away from the perimeter of aperture 75 and are slightly larger than the perimeter of faces 74. Accordingly, in this embodiment the rotor 10 is positioned between the apertures 75 of stator portions 22 and end caps 18 are moved axially apart until the most extreme ramps 73 pass through slots 76 and then rotated so that each end cap 18 is keyed by the faces 74 resting against the periphery of aperture 75.

As shown in FIG. 1, two grooves 80 and 82 are provided on shaft 12. Groove 80 accepts a pointer 84 which may include a standard counterbalance weight (not shown). Pointer 84 is made of a rigid plastic, for example, and is secured to the shaft by any suitable means, such as cementing. Groove 82 accepts two rings 88 each of which has an eccentric mass 90 located on an extension arm 92. Rings 88 may be made of the same material as shaft 12, for example, and have a friction fit in groove 82 so that they may be rotated with respect to the shaft and to each other. Eccentric masses 90 act as balance weights which may be added vectorially to balance the rotor. After balancing, rings 88 are cemented in place. Alternatively the balancing means can be left adjustable, as is desired in aircraft metering.

Those skilled in the art will appreciate that this construction achieves many advantages. For example, the entire unit can be balanced before the rotor is placed into the stator. This minimizes the risk of damage to the often delicate parts of the rotor. A further advantage is that the sensitivity of the instrument can be changed simply by replacing the rotor assembly. A further advantage is the reduction in cost due to the ease of assembly and reduction of parts.

Various modifications may be made to the preferred embodiment described herein. For example, it is not necessary that the shaft be hollow and contain the ribbon. For example, a U- or V-shaped trough could be used, or even a flat truss. Nor is it necessary that both ends of the shaft have a corresponding end cap which is axially movable, so long as it be rotatably movable. Further, a single spring could be positioned at either end of the shaft to tension the ribbon when the end device is moved. Moreover, this invention is not limited to edge mounted coils. With simple modification of the described embodiment, center or eccentric mounted coils can be used, as desired. Numerous other modifications within the scope of my invention can be made. Accordingly, it is preferred that this description be taken in an illustrative sense and that the scope afforded be determined by the following claims.

I claim:

1. In an electric meter including a stator mount, a means for generating a magnetic field, and a coil mounted for rotational movement in said magnetic field, an improvement comprising a self-contained rotor and mount assembly removably engageable with said stator mount, said assembly comprising:
   a rotor shaft having two ends and including means mounting said coil thereon;
   stator engaging means comprising end pieces disposed at each end of said shaft for removably engaging said stator mount;
   filar suspension means for suspending said rotor shaft between said end pieces; and
   spring tension means on at least one of said end pieces for maintaining tension in said filar suspension means
   whereby said self-contained rotor and mount assembly as a unit can be engaged and disengaged by said end pieces.

2. A rotor and mount assembly according to claim 1 wherein said shaft includes a hollow opening passing axially therethrough and said filar suspension means passes through said axial opening.

3. A rotor and mount assembly according to claim 1 wherein said means mounting said coil includes an opening in said shaft passing radially therethrough, said opening being dimensioned to receive one side of said coil.

4. A rotor and mount assembly according to claim 1 wherein said end pieces include an axially movable end cap for engaging each end of said shaft.

5. A rotor and mount assembly according to claim 1 wherein said spring tension means includes an aperture and a curved lever extension, said curved portion being coaxial with said filar suspension means.

6. A rotor and mount assembly according to claim 1 wherein said filar suspension means is connected proximate said coil to a pair of fantail members formed of electrically conductive material, each fantial member having a fantail portion extending radially away from said shaft for traveling in a magnetic air gap of said stator.

7. A rotor and mount assembly according to claim 6 wherein said means mounting said coil includes a lateral opening in said shaft for receiving said coil; and further comprising means for engaging said fantial members affixed to said shaft proximate said lateral opening.

8. A rotor and mount assembly according to claim 7 wherein said fantail members each include neck and shoulder portions, and said fantail engaging means includes a plurality of stop members mounted within said lateral opening and in spaced relationship so that said neck fits between and said shoulder fits beneath said stop members.

9. A rotor and mount assembly according to claim 8 wherein said coil includes a pair of flanges abutting said stop members, said shoulder portions of said fantail members preventing axial movement of said fantial members.

10. A rotor and mount assembly according to claim 1 wherein said rotor shaft includes balancing means for balancing said rotor shaft.

11. A rotor and mount assembly according to claim 10 wherein said balancing means includes an eccentric mass at one end of each of a pair of extension arms and a ring rotatably engaging said shaft at the other ends thereof.

12. A rotor and mount assembly according to claim 1 further comprising a pointer assembly having a pointer and a counter balance.

13. A rotor and mount assembly according to any one of claims 1 to 12 wherein said stator mount includes rotor engaging means corresponding to said stator engaging means having two members separated by a first distance greater than a second distance between said end pieces, said first distance being in predetermined relationship with said second distance so that when at least one of said end pieces is moved axially for engaging said rotor with said stator said spring tension means applies tension to said filar suspension.

14. A rotor and mount assembly according to claim 13 wherein said stator engaging means includes a pair of opposing channels disposed on opposite sides of each of said end pieces, and wherein said rotor engaging means includes a slot in an arm dimensioned to engage the portion of said stator engaging means between said channels.

15. A rotor and mount assembly according to claim 13 wherein said stator engaging means includes a ramp axially disposed on the periphery of each of said end pieces, and said stator engaging means includes two arms, each arm having a hole and a slot to receive each of said end pieces with said ramp.

* * * * *

UNITED STATES PATENT AND TRADEMARK OFFICE
CERTIFICATE OF CORRECTION

PATENT NO. : 4,211,972
DATED : July 8, 1980
INVENTOR(S) : Willem J.L. Boreas

It is certified that error appears in the above-identified patent and that said Letters Patent are hereby corrected as shown below:

Column 1, line 44, "adaped" should read -- adapted --.

Column 2, line 36, "ilustrative" should read -- illustrative --.

Column 3, line 8, "member" should read -- members --.

Column 3, line 12, insert -- be -- between "may" and "secured".

Column 3, line 15, "saft" should read -- shaft --.

Column 3, line 22, "40" should read -- 42 --.

Column 3, line 23, "locatd" should read -- located --.

Column 3, line 24, "aong" should read -- along --.

Column 3, line 52, "berylium" should read -- beryllium --.

Column 4, line 5, "equivalant" should read -- equivalent --.

UNITED STATES PATENT AND TRADEMARK OFFICE
CERTIFICATE OF CORRECTION

PATENT NO. : 4,211,972

DATED : July 8, 1980

INVENTOR(S) : Willem J.L. Boreas

It is certified that error appears in the above-identified patent and that said Letters Patent are hereby corrected as shown below:

Claim 1, column 5, line 56, insert a comma after "means".

Claim 6, column 6, line 13, "fantial" should read -- fantail --.

Claim 7, column 6, line 20, "fantial" should read -- fantail --.

Claim 9, column 6, line 32, "fantial" should read -- fantail --.

Signed and Sealed this

Twenty-fourth Day of August 198.

|SEAL|

Attest:

GERALD J. MOSSINGHOFF

Attesting Officer　　Commissioner of Patents and Trademarks